(12) United States Patent
Petersen et al.

(10) Patent No.: US 10,892,773 B2
(45) Date of Patent: Jan. 12, 2021

(54) ANALOG-TO-DIGITAL CONVERTER AND SENSOR ARRANGEMENT INCLUDING THE SAME

(71) Applicant: TDK Electronics AG, Munich (DE)

(72) Inventors: Henning Petersen, Allerod (DK); Lei Zou, Viken (NO)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/811,357

(22) Filed: Mar. 6, 2020

(65) Prior Publication Data

US 2020/0287564 A1 Sep. 10, 2020

(30) Foreign Application Priority Data

Mar. 7, 2019 (DE) .......................... 10 2019 105 823

(51) Int. Cl.
*H03M 3/00* (2006.01)

(52) U.S. Cl.
CPC ........... *H03M 3/458* (2013.01); *H03M 3/484* (2013.01)

(58) Field of Classification Search
CPC ...... H03M 1/462; H03M 1/183; H03M 1/188; H03M 3/422; H03M 3/442; H03M 3/458; H03M 3/484; H03M 1/0617; H03M 1/08; H03M 1/1009; H03M 1/12; H03M 1/1245; H03M 1/38; H03M 1/466; H03M 1/662; H03M 1/667; H03M 1/68; H03M 1/70; H03M 1/80; H03M 1/804; H03M 3/322; H03M 3/47; H03M 3/49; H03M 3/506; H03M 1/0604; H03M 1/0863; H03M 1/181; H03M 1/442; H03M 3/354; H03M 3/376; H03M 3/486
USPC ................. 341/118–120, 139, 140, 143, 155
See application file for complete search history.

(56) References Cited

U.S. PATENT DOCUMENTS

| | | | | |
|---|---|---|---|---|
| 5,245,434 | A * | 9/1993 | Gurley | H04N 9/68 348/678 |
| 7,551,109 | B1 * | 6/2009 | Ashmore, Jr. | H03M 3/382 341/118 |
| 8,890,727 | B1 * | 11/2014 | Da Silva | H03M 1/185 341/118 |
| 9,866,238 | B1 * | 1/2018 | Thomsen | H03M 3/422 |
| 10,103,744 | B1 * | 10/2018 | Gutta | H03M 3/486 |
| 10,305,498 | B1 * | 5/2019 | Summers | H03L 7/097 |
| 2009/0219185 | A1 * | 9/2009 | Sundstrom | H03M 3/49 341/118 |

(Continued)

OTHER PUBLICATIONS

Bakker, A. et al., "Micropower CMOS Temperature Sensor with Digital Output," IEEE Journal of Solid-State Circuits, vol. 31, No. 7, Jul. 1996, 6 pages.

(Continued)

*Primary Examiner* — Linh V Nguyen
(74) *Attorney, Agent, or Firm* — Slater Matsil, LLP

(57) ABSTRACT

A sigma-delta analog-to-digital converter including a gain element connected to an integrator. The gain element switches between different gain values during consecutive phases of a clock signal having a different number of clock cycles. A counter is configured to count with a different increment step size dependent on the first and second gain values. The converter may be part of a sensor arrangement with a temperature sensor.

13 Claims, 2 Drawing Sheets

(56) References Cited

U.S. PATENT DOCUMENTS

2017/0019124 A1\* 1/2017 Breems ................... H03M 3/50
2019/0319599 A1\* 10/2019 Lee ........................ H03G 3/001

OTHER PUBLICATIONS

Guicquero, W. et al., "Incremental Delta Sigma Modulation with Dynamic Weighted Integration," IEEE 61st International Midwest Symposium on Circuits and Systems (MWSCAS), 2018, 4 pages.
Markus, J. et al., "Incremental Delta-Sigma Structures for DC Measurement: an Overview," IEEE 2006 Custom Integrated Circuits Conference (CICC), 2006, 8 pages.
Robert, J. et al., "A 16-Bit Low-Voltage CMOS A/D Converter," IEEE Journal of Solid-State Circuits, vol. SC-22, No. 2, Apr. 1987, 8 pages.
Zhou, L., "A Resistive Sensing and Dual-Slope ADC Based Smart Temperature Sensor," Analog Integr Circ Sig Process, vol. 85, Issue 1, 2015, 7 pages.

\* cited by examiner

ANALOG-TO-DIGITAL CONVERTER AND SENSOR ARRANGEMENT INCLUDING THE SAME

CROSS-REFERENCE TO RELATED APPLICATIONS

This application claims the benefit of priority of German patent application 102019105823.6, filed Mar. 7, 2019, which is incorporated herein by reference in its entirety.

TECHNICAL FIELD

The present disclosure relates to an analog-to-digital converter. Specifically, the present disclosure relates to an analog-to-digital converter employing the integrating operating scheme. The present disclosure also relates to a sensor arrangement that includes a sensor element and an analog-to-digital converter of the integrating operating scheme.

BACKGROUND

Analog-to-digital converters (ADCs) are widely used in electronic devices to convert an analog input signal such as an analog voltage signal or an analog current signal to a digital value that can be further processed by digital signal processing circuitry. The analog input signal to an ADC of the present disclosure is a DC signal that is constant or substantially constant during a conversion cycle. The DC signal may be generated from sources that provide a variable signal that changes very slowly so that it can be regarded a DC signal during the conversion period. An analog-to-digital converter according to the integrating working principle is also known as a sigma-delta ADC.

One DC input is converted by the ADC into a corresponding digital pattern during one conversion period. Thereafter another DC input is converted into a corresponding pattern.

In such cases the resolution of the ADC relies on the number of clock cycles used for one DC input conversion period.

FIG. 1 shows a conventional first order sigma-delta ADC to convert a DC input signal VIN to a digital output bitstream BS. In order to achieve an 11-bit resolution of the ADC a number of $2^{11}=2048$ clock cycles are needed to complete one conversion cycle and convert one DC input signal VIN to one digital output code BS that represents the input signal VIN. Each clock cycle during the sigma-delta operation requires electrical power caused by the integration process and the switching of states in the digital elements of the ADC. A number of, e.g., 2048 clock cycles for one DC input conversion leads to a correspondingly large energy consumption per conversion cycle, which may be a disadvantage for low power or battery-based applications.

It is an object of the present disclosure to provide an analog-to-digital converter of the sigma-delta working principle that consumes less power while maintaining the conversion accuracy.

It is another object of the present disclosure to provide a sensor arrangement using a sigma-delta analog-to-digital converter having a high conversion accuracy and consuming low power.

SUMMARY

According to embodiments, an analog-to-digital converter comprises the features disclosed herein.

According to the present disclosure, a gain element of switchable different gain values is provided upstream of the integrator. The gain element may switch between a first and a second gain so that the ADC operates during a first number of cycles of the clock signal with the first gain and, thereafter, during a second number of clock cycles with the second gain. A counter that is connected downstream of the comparator converts the bitstream generated by the comparator into a digital value that represents the converted analog signal. The counter selectively performs a counting according to a first increment step size or to a second increment step size dependent on the first and the second gain values of the gain element, respectively. The increment step size of the counter is selected in dependence on the gain value such as the first and second gain values from the gain element. The counter value is increased by the first or second increment step size in response to a clock signal applied to the clock control terminal of the counter.

According to an embodiment, the first number of clock cycles of the clock signal, during which the first gain is operative, is larger than the second number of clock cycles during which the second gain is operative. During the first number of clock cycles the first gain is at a high value and during the second number of clock cycles the second gain is at a low value so that the first gain is larger than the second gain. A counting step during the first number of clock cycles has a higher increment step size than a counting step during the second number of clock cycles. The increment step size of the counting is proportional to the relation between first and second gains.

During the counting operation of the counter, in more detail, the first increment step size is larger than the second increment step size, wherein the first increment step size is selected in response to the first gain and the second increment step size is selected in response to the second gain. This operation ensures that the counting operation during the first gain has a higher weighting than the counting operation during the second gain.

According to embodiments, the analog signal is a constant signal during the conversion period. The conversion period is composed of the first and the second number of clock cycles that constitute an integrating sigma-delta operation with the first gain and thereafter with the second gain. The analog signal may vary in dependence on mechanical or ambient states, however, this variation is very slow compared to the conversion period. At least, the analog input signal is substantially constant in that it may have very little variation such that the conversion process is not disturbed. The analog input signal to be converted by the sigma-delta ADC may be regarded as a DC signal relative to the time window of the conversion period. This may be the case when the analog input signal is generated by a temperature sensor generating a temperature-dependent voltage or a pressure sensor generating a pressure-dependent voltage or a Hall sensor generating a voltage in response to a magnetic field measured by the Hall sensor. The magnetic field may depend on a mechanical operating state or on another physical condition.

According to embodiments, the integrator comprises an amplifier and a capacitor that is connected between the amplifier output and the amplifier input to generate a virtual ground node which is the integration node. A first and a second resistor of different resistance may be selectively connected to the virtual ground node and the capacitor. The selective connection is controlled in response to the currently selected one of the first and second gains. The selective connection of the first and second resistor may be achieved by switches that are controlled according to the first and second gains.

According to embodiments, a switch is connected in parallel to the capacitor to short circuit the capacitor and bring the capacitor into a defined state at the beginning of the integration process or at the beginning of a conversion period. This ensures that the integrator is reset at the beginning of a conversion period in that any residual charge on the capacitor resulting from previous conversion periods is removed. This ensures a defined state of the capacitor and the integrator at the beginning of a conversion period.

According to embodiments, the first and second gains G1, G2 of the gain block have a ratio G1/G2. The first increment step size S1 and the second increment step size S2 of the counter have the same ratio S1/S2=G1/G2. In an exemplary embodiment, the sigma-delta ADC may have a resolution of 11 bits, that is 2048 incremental steps. The first gain may equal to 4 and the second gain may equal to 1, G1/G2=4. Accordingly, the first increment step size of the counter equals 4 and the second increment step size of the counter equals 1, S1/S2=4. Accordingly, the relation between first and second gains and first and second increment step sizes should be the same. In this case, the first number of clock cycles may be 510 and the second number of clock cycles may be 8 so that a conversion period comprises 510+8=518 steps, which is close to a quarter of the 2048 steps required by a conventional sigma-delta ADC or a reduction of close to three quarters of clock cycles although achieving a resolution of 2048 steps. The AD conversion process according to the present disclosure is relatively fast, requires less clock cycles to complete one conversion than in a conventional case and, consequently, requires low power.

According to embodiments, a switch is connected to a clock input terminal of the counter and the terminal for the clock signal. The switch is controlled by the output of the comparator. In dependence on the level of the output signal of the comparator the switch is closed and forwards the clock signal to the counter so that either one of the first or second increment step sizes can be performed by the counter.

According to embodiments, the first and second resistors that are selectively and switchably connected to the virtual ground node of the amplifier have a relation of 1/X, wherein the first resistor has a resistance value of R and the second resistor has a resistance value of X*R. Consequently, the ratio between the first gain, when the first resistor of resistance value R is active, and the second gain, when the second resistor of resistance value X*R is active, is G1/G2=X. Consequently, the counter needs to count by an increment step size of X when the first resistor is active and needs to count by an increment step size of 1 when the second resistor is active.

One or more of the above-mentioned objectives are achieved by a sensor arrangement according to the features of present claim 11.

The sensor arrangement includes a sensor element configured to generate a variable output voltage such as a temperature sensor element that generates a voltage dependent from temperature, a pressure sensor element configured to generate a voltage dependent from a pressure exerted on the pressure sensor and a Hall sensor element configured to generate a voltage dependent from a magnetic field that may be measured through the Hall effect. Other sensor elements that generate voltages dependent on the sensor state are also useful. The voltage generated by the sensor element is a DC signal during the conversion period. Another voltage generator is connected to the reference voltage input of the ADC generating a constant voltage independent of temperature. Such a voltage generator may include a bandgap voltage generator.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
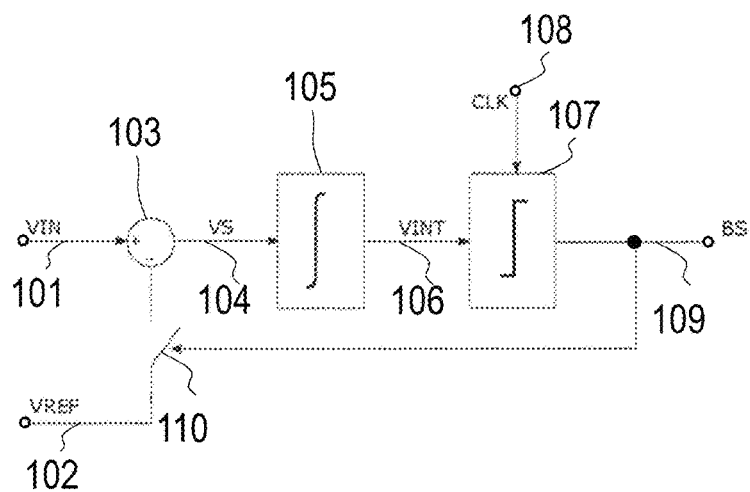
FIG. 1 shows a conventional sigma-delta analog-to-digital converter.

FIG. 1 depicts a block diagram of a conventional first order sigma-delta ADC. An analog input signal such as input voltage VIN to be converted to a digital representation is supplied to input terminal 101. A summer 103 combines the input voltage VIN with a feedback path. The output 104 of the summing node 103 is differential signal VS that is forwarded to the integrator 105. The integrator 105 generates an integration voltage VINT at its output terminal 106. A comparator 107 is connected downstream of the integrator 105 wherein the output 106 of the integrator 105 is connected to the input of the comparator 107. The comparator 107 is controlled by clock signal CLK at its clock input terminal 108. The output of the comparator 107 supplies a stream of bits BS. The comparator compares its input signal with a threshold. Specifically, the comparator generates an output signal in dependence on the sign of the input signal supplied to the comparator. More specifically, the comparator 107 takes the sign of its input signal and outputs a "1" if its input signal is positive and outputs a "0" if its input signal is negative. The sign of the input signal of the comparator is taken with a pulse of the clock signal CLK so that every pulse of the clock signal CLK reads out the sign of the input signal to the comparator. The output of the comparator is provided as a feedback to the input side of the ADC. Specifically, the output 109 of the comparator 107 controls a switch no which is connected between a terminal 102 for a constant reference voltage VREF and another input terminal of the summing node 103. The feedback loop should include a feedback path that generates a negative feedback so that the difference signal VS at the output 104 of the summing node 103 is reduced.

During the operation of the conventional first order sigma-delta ADC of FIG. 1, when running over a long time, the negative feedback leads to an average input signal VS to the integrator 105 equal to zero resulting in the following relation:

$$R(BS)=VIN/VREF,$$

wherein BS is the bitstream and R(BS) is the ratio of ones "1" to the total number of bits in the bitstream. There is a one-to-one mapping between the DC input signal VIN and the resulting bitstream pattern BS.

The sigma-delta ADC of FIG. 1 each time converts only one DC input signal VIN into one corresponding output signal BS. Then, the ADC is reset so that the integrator is reset before converting the next DC input. It is to be noted that AC parameters from frequency analysis are not meaningful for the operation principle described in connection with the sigma-delta ADC of FIG. 1 which is a major difference of the presently disclosed concepts to other sigma-delta ADCs with running waveform inputs such as sinewave inputs or other high frequency input signals.

In a high resolution example case of, for example, $2\exp 11=2^{11}=2048$ steps an acceptable quantization error may be achieved. The 11 bits of ADC resolution are used to accurately digitize the input voltage VIN. For example, if the input signal is VIN=(1/2048)*VREF, that is the minimal detectable input signal or the quantization resolution, the output bitstream signal BS includes a bitstream of 010 . . . 0, that is one "1" and 2047 zeros "0". A full conversion period in this example requires at least 2048 clock cycles of the clock signal CLK to find 11 bits of resolution. In general, a standard first order sigma-delta ADC with DC input signal VIN must be operated through $2^N$ clock cycles to complete one conversion of VIN into a corresponding bitstream signal BS to achieve N bits of resolution, N being a natural number. The more clock cycles to complete one conversion of VIN, the more energy is required to operate the ADC. Each clock cycle consumes power and the energy consumption per conversion depends on or scales with the number of clock cycles which is dependent from the desired number of bits of resolution.

Figure 2:
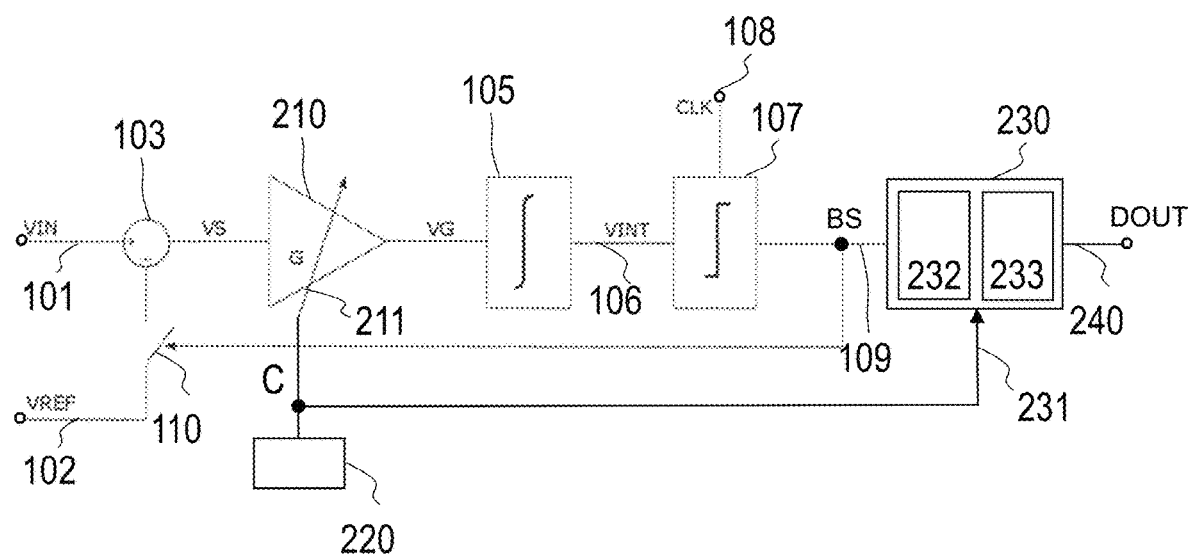
FIG. 2 shows a sigma-delta analog-to-digital converter according to the principles of the present disclosure.

FIG. 2 shows an improved first order sigma-delta analog-to-digital converter according to the principles of the present disclosure. The sigma-delta ADC is based on summer 103, integrator 105 and comparator 107 already discussed in connection with FIG. 1.

According to embodiments of the present disclosure, a gain block 210 is provided that is connected upstream of the integrator 105 and downstream of the summing node 103. An input of gain block 210 receives the differential signal VS at the output of the summing node 103 and an output of the gain block 210 supplies amplified differential signal VG to the input of the integrator 105. The gain block 210 exhibits at least two different operational states with different gains such as a first gain G1 and a second gain G2. In an example, the first gain G1=4 and the second gain G2=1. The gain value of gain block 210 is controlled through a controller 220 that generates a corresponding control signal C that is forwarded to a control input 211 of gain block 210. During a first operational state the gain block 210 operates with the first gain G1=4 and during a subsequent, consecutive second operational state the gain block 210 is operated with the second gain G2=1.

According to the principles of the present disclosure, gain block 210 switches gain during operation. The sigma-delta ADC firstly runs, e.g., 510 clock cycles wherein the gain G is set to G1=4. Subsequently, the ADC runs, e.g., 8 clock cycles wherein the gain G is set to G2=1. In total, during a full conversion period to convert the input signal VIN to an output bitstream BS, a number of 510+8=518 clock cycles are used to obtain the resolution of 11 bits. Compared to the standard first order sigma-delta ADC of FIG. 1, which requires 2048 clock cycles, the improved ADC of FIG. 2 requires a substantially reduced number of clock cycles to complete one conversion of input signal VIN to corresponding bitstream signal BS. The rate of reduction from, e.g., 2048 clock cycles to 518 clock cycles is about three quarters (¾).

During the first period of conversion with the first gain value G1 being higher than the subsequent second gain value G2, G1>G2, each bit of the bitstream BS is expanded. The expansion factor is equal to the relation between the first and second gain values G1/G2. In response to one bit of the signal BS, G1/G2 consecutive bits for each clock cycle of clock signal CLK are generated as each bit of bitstream BS needs to be weighted higher during the first operational phase with gain factor G1 when compared to the second operational phase with gain factor G2.

This weighting operation is performed by a specific counter 230 connected downstream of the output 109 of comparator 107. The bitstream BS is converted into a digital output value DOUT at the output terminal 240 of counter 230. The output signal DOUT can be forwarded to digital signal processing circuitry that performs calculations or operations in response to the determined digital value DOUT. For example, if the input signal VIN is a temperature-dependent signal, the output signal DOUT is the digital representation of the temperature that can be used in the digital signal processing circuitry.

The counter 230 has two operational modes 232, 233, wherein the operational mode 232 is active during the first phase using gain G1 and the second operational mode 233 is active during the second operational mode using gain G2. During the first operational mode 232, the step size of counter 230 is higher, reflecting the higher gain value G1. During the second operational mode 233 the step size is lower, reflecting the lower gain value G2. In practice, during the first operational mode of G1=4, the step size of mode 232 is +4 steps. During the second operational mode of G2=1, the step size of mode 233 is +1 step. The control signal C from controller 230 is also forwarded to the control input 231 of counter 230 to switch between operational modes 232 and 233. Counter 230 may include a first counter to perform operational mode 232 and a second counter to perform operational mode 233.

At counter 230 in the case of the first number of, e.g., 510 clock cycles during the higher gain of G1=4, one bit of the bitstream BS is expanded to a sequence of four bits. If the bitstream bit BS="0", the expanded bit sequence is "0000". If BS="1", the expanded bit sequence is "1111". The 510 clock cycles yield four times the number of the actual bits of bitstream signal BS becoming a total number of 2040 bits. A sample output of the digital output signal DOUT taken somewhere after the device has started and cut off somewhere before the devicet finishes is, for example:

"—0.0000.1111.1111.0000—0.1111.0000—"

where the dots denote when the comparator 107 outputs a single bit of bitstream BS. The dot expresses the expansion of one bit BS into several bits thereby preceding every four expanded bits with a dot. In total, one conversion period for one input signal VIN includes the first and second period of counting cycles so that the clock signal CLK counts 510 cycles for the first period and eight cycles for the second period, resulting in 518 clock cycles of clock signal CLK at terminal 108 for one conversion period. This achieves the same conversion result as a conventional sigma delta ADC of FIG. 1 during 2048 clock cycles. The improved ADC of FIG. 2 reaches 11 bits of resolution by only 518 clock cycles which is a reduction of about ¾.

Figure 3:
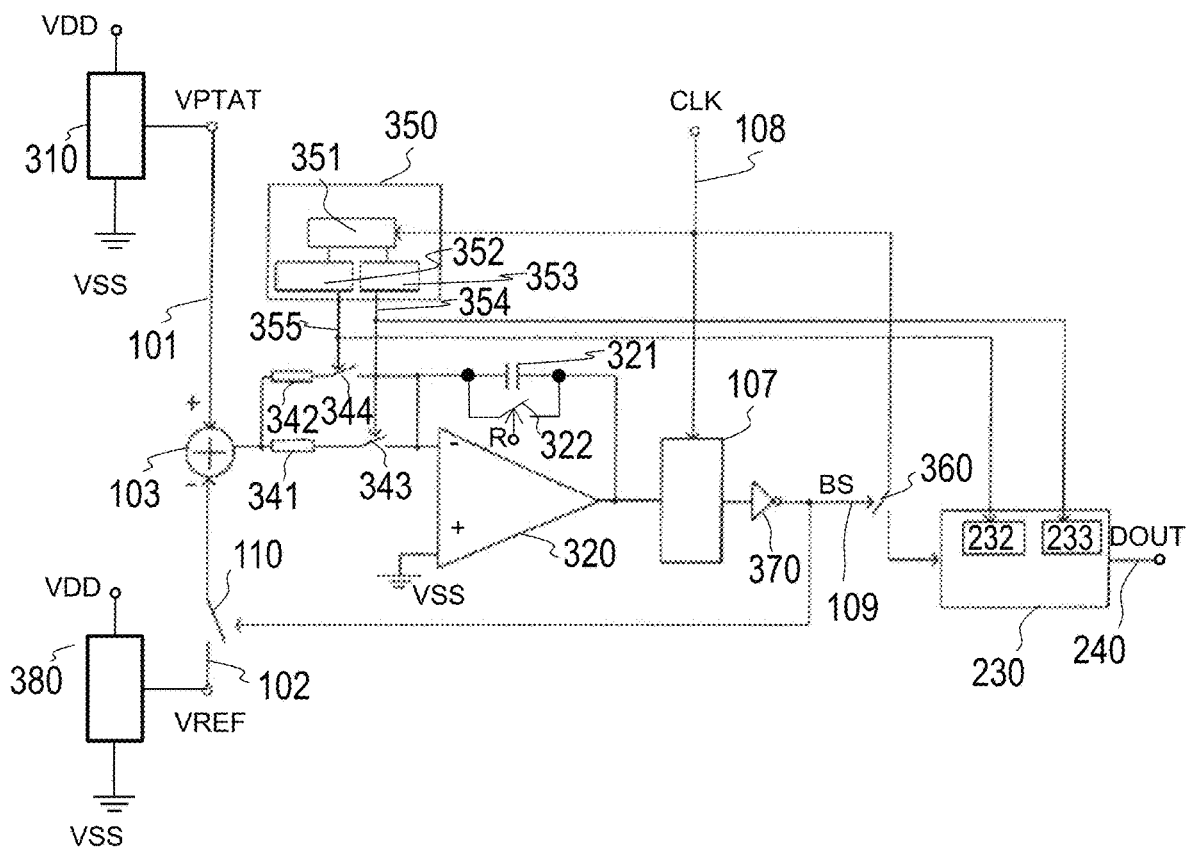
FIG. 3 shows a detailed block diagram of a sensor arrangement including an embodiment of a sigma-delta analog-to-digital converter.

Turning now to FIG. 3, a sensor arrangement that includes a sensor element 310 such as a temperature sensor to generate a sensor signal including a more detailed block diagram of a sigma delta ADC is shown. It is to be noted that the sigma delta ADC according to the present disclosure may also be used with other sensor circuits such as a pressure sensor or a Hall sensor.

For the purpose of the following exemplary explanation, it is assumed that sensor element 310 is a temperature sensor that generates, for example, a voltage signal dependent from temperature. The voltage may be a voltage proportional to absolute temperature VPTAT. In the field of temperature sensors, the temperature-dependent signal changes only very slowly so that it can be regarded as a DC signal during the conversion period of a sigma-delta ADC. Each DC signal is converted into a bitstream pattern BS. At each temperature conversion period, one DC input is converted by the ADC into a corresponding digital bitstream pattern BS. The first order sigma-delta ADC of FIG. 3 is energy efficient and may be implemented on an integrated semiconductor chip requiring relatively little semiconductor area. This achieves a digital temperature sensor of low manufacturing cost and low energy consumption or cost during operation. The sensor also requires a constant voltage reference independent from temperature such as voltage VREF generated by voltage source 380 which may include a bandgap voltage source that is able to generate a voltage independent from temperature, widely known to persons skilled in semiconductor circuit design. The energy costs during operation of the device are kept low, although targeting an 11-bit resolution of the ADC.

With 11 bits of resolution and, e.g., covering a temperature range of 600 Kelvin, approximately 0.29° C. temperature accuracy of the digital temperature signal is achieved (600 K/$2^{11}$=0.29° C.). The VPTAT signal is a voltage proportional to the Kelvin temperature. At 0 Kelvin (0 K=−273,13° C.), the VPTAT signal is 0 volts. The slope of VPTAT is implementation specific. The temperature may range from 0 Kelvin to an upper range limit that is determined by the selected values of VPTAT and VREF. For example at VPTAT=VREF, the temperature may be 600 K leading to an approximate temperature accuracy of 0.29° C. over the temperature range of 600 K. As explained above, 518 clock cycles of clock signal CLK are required to perform one conversion of the temperature-dependent voltage signal VPTAT.

With regard to FIG. 3, the detailed diagram of the sigma-delta ADC includes the following components. An integrator comprises an operational amplifier 320 and a capacitor 321 which is connected between the output and the inverting input "−" of amplifier 320. The non-inverting input "+" of the operational amplifier 320 is connected to ground potential VSS. This configuration of the operational amplifier generates a virtual ground node at its inverting input. The virtual ground node is switchably connected to resistors 341, 342 that realize the different gain states of the gain block of FIG. 2. The resistors 341, 342 are connected to the output of the summing node 103. Switches 343, 344 are connected between the resistors 341 and 342, respectively, and the inverting input of the operational amplifier 320. The switches 343, 344 are controlled by a controller 350 which counts the first phase and second phase conversion steps of the sigma-delta ADC. Controller 350 includes a counter 351 which includes a decoding block 352 that generates a signal at terminal 355 to control switch 344 to enable resistor 342. Another decoder 353 in controller 350 generates a control signal for switch 343 at terminal 354 to enable resistor 341.

Resistor 342 relates to the first gain G1 of the gain block and resistor 341 relates to the second gain G2 of the gain block. Following the above 11-bit resolution example, resistor 342 has a value of R to generate a gain value of G1=4, wherein resistor 341 has a resistance value of 4*R to generate a gain value of G2=1 that is G1/G=4. Switch 344 is conductive during the first operational phase of gain G1=4 and switch 343 is conductive during the second operational phase of gain G2=1. Accordingly, resistor 342, 341 and corresponding switches 344, 343 realize the gain block 210 of FIG. 2. The control outputs 355, 354 of controller 350 are also forwarded to counter 230 to control the operational modes 232, 233, wherein mode 232 counts with a higher increment step size S1 of, e.g., +4 to represent the higher gain of resistor 342 and operational mode 233 represents a lower increment step size S2 of, e.g., +1 to represent the lower gain mode by resistor 31 that is S1/S2=4. The clock control of counter 230 is provided by a switch 360 which connects the clock input terminal 108 for clock signal CLK to the clock input of counter 230. The switch 360 is operated by the output of comparator 107. Since the integrator is an inverting integrator, an inverter 370 at the output of comparator 107 ensures the proper polarity of the signals. The clock signal CLK is provided to the controller 350, the comparator 107 and through switch 360 to counter 230. The switch no turns on when the bitstream signal BS gets a signal level "1" so that the temperature-independent reference voltage VREF is subtracted from the voltage VPTAT in summing node 103.

The integrating capacitor 321 is to be short-circuited through a switch 322 connected in parallel to capacitor 321 that can be operated by a reset signal R. The integrating capacitor 321 is reset to a zero state at the beginning of a conversion cycle to provide a predetermined, defined starting point of the integrating operation.

The digital output signal DOUT corresponds to the analog input signal VPTAT related to VREF and is representative of the temperature. The signal BS consists of ones and zeros, wherein the ratio of ones to the total number of bits in the signal BS in one conversion period represents the temperature information of VPTAT/VREF. This is a common way to read out temperature information in digital temperature sensors that can be interpreted and further processed by downstream connected digital signal processing circuitry. The digital output signal DOUT may be a digital number which is the sum of the count values obtained by operational modes 232 and 233. The ratio VPTAT/VREF equals the ratio between DOUT and the maximum of DOUT where VPTAT/VREF=1.

While FIG. 3 shows a integrator based sigma delta ADC using an operational amplifier as a sample embodiment, other types of sigma delta implementations may also be used.

Figure 4:
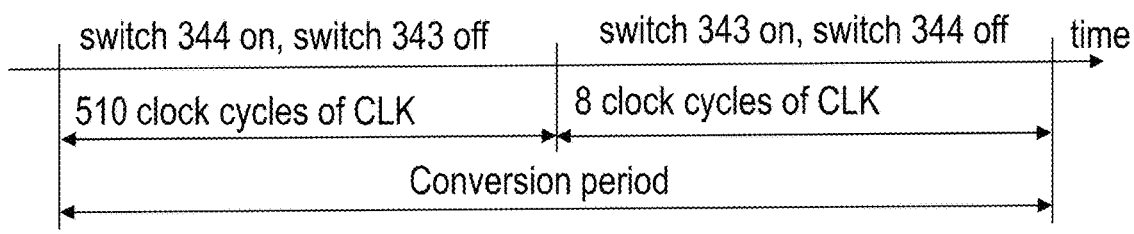
FIG. 4 shows a timing diagram of a sigma-delta conversion period.

Turning now to FIG. 4, a time diagram of a conversion cycle is depicted. The timing diagram shows a first conversion sub-period of 510 clock cycles of clock signal CLK wherein switch 344 is on or conductive and switch 343 is off or non-conductive. When switch 344 is on, the gain is G1=4 and resistor 342 having a resistance value of R is enabled. During the subsequent conversion sub-period, switch 343 is on and switch 344 is off enabling resistor 341 having a resistance value of 4R to realize a gain of G2=1. The second conversion sub-period lasts for 8 clock cycles of clock signal CLK wherein the resistor 341 having a resistance value of 4*R is enabled. During the first conversion sub-period, the counter 230 increments by +4 steps. During the second conversion subperiod, the counter 230 increments only by +1 step. When the bitstream signal BS is "0", switch 360 turns off and the clock signal CLK is not forwarded to the counter 230 so that the counter 230 holds the previous value and performs no counting.

The present example accommodates $2048=2^{11}$ levels. The selection of $2^N$ levels may be advantageous from a design perspective. The 2048 levels yield 2048 bits of the bitstream BS which in turn yields the number of bits during the phase when G1 is active and during the phase when G2 is active according to the formula:

$$\text{Bits}G1*G1/G2)+\text{Bits}G2=2048,$$

wherein BitsG1 represents the number of bits in the mode when the gain is G1 and BitsG2 represents the number of bits in the mode when the gain is G2. In the present sample embodiment, the total number of bits is 2048, however, more generic, it could be anything, changing BitsG1, BitsG2 and gain modes G1, G2 correspondingly. The specific values of BitG1 and BitG2 affect the AD conversion resolution as well as the possible range of the input voltage VIN to be converted.

In conclusion, the circuit in FIG. 3 depicts an area efficient, low energy consumption temperature sensor. The use of two different gain values during the integration operation of a sigma-delta ADC followed by a corresponding weighting of the ones and zeros generated by a comparator in a counter enabling the counting of different weighting values achieves high conversion accuracy at low energy consumption. Although described in connection with a temperature-dependent voltage, other sensors generating an output signal depending on a physical state having DC quality during a conversion cycle may also be used.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirit and substance of the disclosure may occur to the persons skilled in the art, the disclosure should be construed to include everything within the scope of the appended claims.

What is claimed is:

1. An analog-to-digital converter, comprising:
an input terminal for an analog signal to be converted;
a first output terminal for a digital signal representing the analog signal to be converted;
a terminal for a reference signal;
a summing node connected to the input terminal for the analog signal to be converted, the summing node having a second output terminal;
an integrator connected downstream of the summing node;
a comparator connected downstream of the integrator and having a terminal for a clock signal and further having an output;
a feedback loop including a switch controlled by the output of the comparator, the switch connected between an input of the summing node and the terminal for the reference signal;
a gain element connected between the second output terminal of the summing node and the integrator, the gain element configured to switch between a first gain and a second gain, the first gain being different from the second gain, wherein the gain element is configured to operate with the first gain during a first number of cycles of the clock signal and to operate with the second gain during a consecutive second number of cycles of the clock signal; and
a counter connected downstream from the comparator, the counter configured to selectively count one of a first increment step size and a second increment step size in response to a signal from the comparator and dependent on one of the first gain or second gain, the counter connected to the first output terminal to provide the digital signal.

2. The analog-to-digital converter according to claim 1, wherein the first number of cycles of the clock signal is larger than the second number of cycles of the clock signal, and wherein the first gain is larger than the second gain.

3. The analog-to-digital converter according to claim 2, wherein the first increment step size is larger than the second increment step size, wherein the first increment step size is selected in response to the first gain, and wherein the second increment step size is selected in response to the second gain.

4. The analog-to-digital converter according claim 1, wherein the integrator comprises an amplifier, a capacitor coupled between an input and an output of the amplifier, and a first resistor and a second resistor of different resistance selectively connected to the input of the amplifier and the capacitor in response to the selected one of the first gain and second gain.

5. The analog-to-digital converter according to claim 4, further comprising a switch connected in parallel to the capacitor and configured to reset the integrator at the beginning of a conversion period.

6. The analog-to-digital converter according to claim 1, wherein the first gain and second gain have a ratio, and wherein the first increment step size and the second increment step size of the counter have the same ratio.

7. The analog-to-digital converter according claim 1, wherein the analog signal is a constant signal or a substantially constant signal during a conversion period comprising the first number of cycles of the clock signal and the second number of cycles of the clock signal.

8. The analog-to-digital converter according to claim 1, further comprising a switch connected between a terminal for the clock signal and a clock input terminal of the counter, the switch comprising a control terminal connected downstream the comparator.

9. The analog-to-digital converter according to claim 1, wherein the summing node comprises a summer comprising a first input terminal connected to the analog signal and a second input terminal, wherein the summer is configured that the signal at the second input terminal is subtracted from the analog signal.

10. The analog-to-digital converter according to claim 1, comprising:

an operational amplifier having an inverting input and a non-inverting input;

an output of the operational amplifier connected through an integrating capacitor to the inverting input of the operational amplifier;

a first and a second resistor of different resistance connected to the inverting input of the operational amplifier through respective switches, wherein the first resistor has a resistance of R and the second resistor has a resistance of X*R, and wherein the counter is configured to count by an increment of X steps when the switch connected to the first resistor is conductive and the counter is configured to count by an increment of 1 step when the switch connected to the second resistor is conductive.

11. A sensor arrangement, comprising:

a sensor element configured to generate a variable output voltage;

a voltage generator configured to generate a constant voltage independent from temperature;

the analog-to-digital converter according to claim 1, wherein the sensor element is connected to the input terminal for an analog signal of the analog-to-digital converter and the voltage generator is connected to the terminal for a reference signal of the analog-to-digital converter.

12. The sensor arrangement according to claim 11, wherein the sensor element comprises at least one of:

a temperature sensor configured to generate an output voltage dependent from temperature; or a pressure sensor configured to generate an output voltage dependent from a pressure exerted on the pressure sensor;

a hall sensor configured to generate an output voltage dependent from the hall effect.

13. The sensor arrangement according to claim 11, wherein the sensor element is configured to generate a variable output voltage that is constant during a conversion cycle.

* * * * *